United States Patent [19]

Nakazawa et al.

[11] Patent Number: 4,546,412
[45] Date of Patent: Oct. 8, 1985

[54] ELECTRONIC DEVICE FOR AUTOMOBILE

[75] Inventors: Terumi Nakazawa, Naka; Hitoshi Minorikawa, Mito; Kazuhiko Kawakami, Katsuta, all of Japan

[73] Assignee: Hitachi, Ltd., Tokyo, Japan

[21] Appl. No.: 609,835

[22] Filed: May 14, 1984

[30] Foreign Application Priority Data

May 12, 1983 [JP] Japan ................................ 58-83362

[51] Int. Cl.⁴ .............................................. H05K 5/02
[52] U.S. Cl. .................................... 361/395; 361/421; 174/52 PE
[58] Field of Search ............... 307/10 R, 150; 357/72; 174/52 PE; 361/380, 381, 386, 387, 395, 399, 400, 408, 421

[56] References Cited

U.S. PATENT DOCUMENTS 3,383,565  5/1968  Gritton ........................ 174/52 PE
3,771,024  11/1973  Dumas ........................ 174/52 PE
3,906,144  9/1975  Wiley ........................ 174/52 PE Primary Examiner—G. P. Tolin
Attorney, Agent, or Firm—Antonelli, Terry & Wands

[57] ABSTRACT

An electronic device for an automobile is roughly divided into individual parts and control circuit elements which are mounted in a casing divided into two compartments, according to the present invention. The individual parts are arranged in one compartment and are covered with silicone rubber to improve their water resistance. The control circuit elements are arranged in the other compartment and are covered with a silicone gel to prevent any stresses acting upon the control circuit elements, such as ICs, and provide these elements with moisture resistance. The control circuit elements are bonded by high-temperature solder to improve their heat resistance, but the individual parts are bonded by eutectic solder.

9 Claims, 2 Drawing Figures

ELECTRONIC DEVICE FOR AUTOMOBILE

BACKGROUND OF THE INVENTION

The present invention relates to a control module which controls the engine of an automobile or the like and, more particularly, to an electronic device which is suitable for integral attachment to an actuator controlling the engine.

A conventional device for controlling the engine of an automobile is mounted in the passenger compartment. For this purpose, both the control circuit elements constituting the electronic device and the individual parts for removing noise from lead wires are attached by a eutectic solder with a low melting point.

In recent years, however, it has become necessary to integrally attach such an electronic device to the carburetor, etc., because it is necessary to mount the electronic device in the vicinity of an actuator. Since the various elements of the electronic device cannot stand being attached by eutectic solder, it is the current practice that the parts other than those for which the eutectic solder must be used are attached by a solder with a high melting point. More specifically, the control circuit elements, such as power transistors, ICs, and capacitors, are attached to the control circuit substrate by a high-temperature solder, and then the individual parts, such as diodes for filtering out noise from the lead wires, are attached by a eutectic solder. These attachment operations are conducted after the entire control circuit substrate is heated to 330° C. for the high-temperature solder, and after the entire control circuit substrate is heated to 230° C. for the eutectic solder. Since the substrate is heated again after the first attachment operation, the electronic device of the prior art has the defect that the lives of the control circuit elements are reduced.

SUMMARY OF THE INVENTION

It is an object of the present invention to provide an electronic device in which the lives of the control circuit elements are not reduced.

According to the present invention, the lives of the control circuit elements are extended by dividing the inside of the casing of the electronic device into two compartments by a partition to provide a side thereof for a control circuit substrate and a side for individual parts, by attaching the control circuit substrate by high-temperature solder and the individual parts by eutectic solder, and by filling the control circuit substrate side with a gel material such as, for example, silicone gel and the individual part side with an organic material, such as a rubbery material, e.g., silicone rubber.

DESCRIPTION OF THE PREFERRED EMBODIMENT

The present invention will be described in the following in connection with an embodiment thereof.

Figure 1:
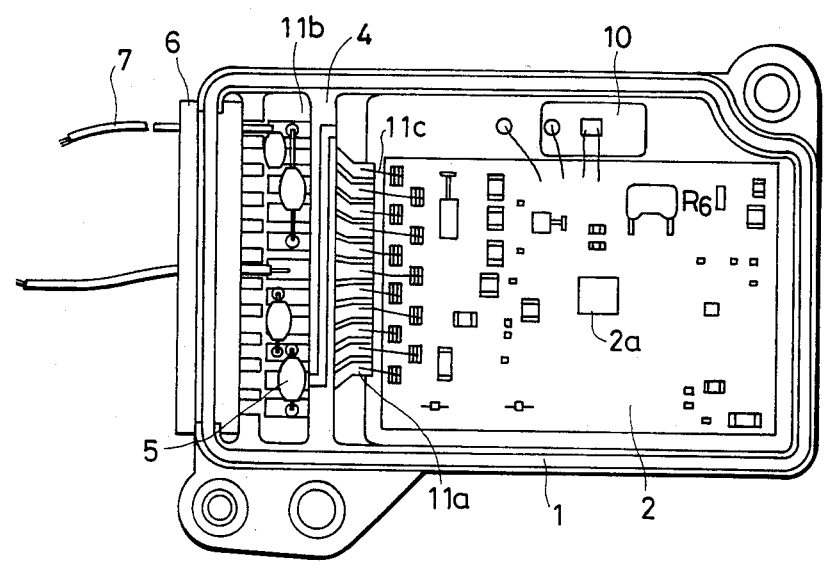
FIG. 1 is a top plan view of an embodiment of the present invention.
Figure 2:
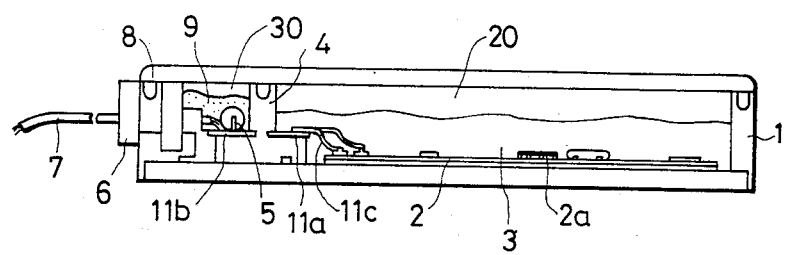
FIG. 2 is a section through the embodiment of FIG. 1.

FIG. 1 is a top plan view of an embodiment of the present invention, and FIG. 2 is a section therethrough. As shown, a casing 1 of an electronic device is provided with a partition 4 which divides the interior of the casing, together with a cover 8 of the casing 1, as shown in FIG. 2, into a compartment 20 which is provided with a control circuit substrate 2, which has hot-soldered parts (e.g., parts soldered to the substrate using high-temperature solder), such as microcontrol chips 2a mounted therein, and a power transistor 10; and a compartment 30 which is provided with a lead frame 11b connecting lead wires 7 attached through a grommet 6 fixed to the casing 1. The partition 4 is provided with a lead frame 11a in addition to the lead frame 11b. The first lead frame 11a is connected to the terminals of the control circuit substrate 2 by wire bonding 11c, and the second lead frame 11b is connected to the lead wires 7, as described above. The lead frames 11a and 11b are molded into the partition 4 and are connected to each other by capacitors (not shown). Individual parts 5, such as capacitors for filtering out noise, are connected to the lead frame 11b by eutectic solder. The lead wires 7 are shielded with rubber so that no water can penetrate the casing 1.

The compartment 20 is filled, as shown in FIG. 2, with a silicone gel (for example, K-104, a product of Shinetsu Kagaku KK) 3 which forms a gel at a predetermined temperature. The compartment 30 is filled, as shown in FIG. 2, with an organic material (for example, silicone rubber) 9 which can be heated to form a rubbery state at a predetermined temperature.

Incidentally, simple elements 2a which are not molded with resin are used as the control circuit elements mounted on the control circuit substrate 2. This is because such molded elements would be subjected to thermal stresses by the increased temperature resulting from the integral bonding of the electronic device to the carburetor, which would damage the elements. This is why the silicone gel 3 is used to prevent the penetration of moisture. In this regard, it is preferred that the gel material have a coefficient of expansion substantially the same as that of the substrates of the control circuit elements, to avoid stresses acting on the elements.

As a result, according to the present embodiment, the individual parts are attached by heating only the lead frame 11b after the control circuit elements have been attached by the hot-temperature solder with only the control circuit substrate 2 heated, so that the elements are not damaged by heat.

According to the present embodiment, moreover, because of the provision of the partition 4, two different fillers can be used, and a gel filler can be used on the control circuit substrate so that no stresses are exerted on the ICs, etc. Still moreover, the individual parts are provided with sufficient resistance against any moisture entering via the lead wires because they are sealed in by the cover.

According to the present embodiment, furthermore, the electronic device is provided with a sufficient strength with respect to head, because simple control elements are used.

As has been described hereinbefore, according to the present invention, the lives of the control circuit elements are not reduced in any way.

While we have shown and described several embodiments in accordance with the present invention, it is understood that the present invention is not limited to the previously disclosed embodiments, but is susceptible of numerous changes and modifications as known to one having ordinary skill in the art and we, therefore, do not wish to be limited to the details shown and described herein, but intend to cover all such modifications as are encompassed by the scope of the appended claims.

What is claimed is:

1. An electronic device for an automobile comprising:
a casing sealed with a cover and which is divided into first and second compartments by a partition; lead frames mounted in said partition; a control circuit substrate mounted in said first compartment, connected to one side of said lead frames, and covered with a gel material; and individual parts mounted in said second compartment, connected to the other side of said lead frames, and covered with a rubbery material.

2. The electronic device according to claim 1, further comprising control circuit elements mounted on said control circuit substrate, wherein said control circuit elements mounted on said control circuit substrate are selected from power transistors, ICs and capacitors.

3. The electronic device according to claim 2, wherein said control circuit elements are bonded onto said control circuit substrate by high-temperature solder.

4. The electronic device according to claim 2, wherein said gel material has substantially the same coefficient of expansion as that of the substrate of said control circuit elements.

5. The electronic device according to claim 4, wherein said gel material is a silicone gel.

6. The electronic device according to claim 2, wherein said control circuit elements comprise elements not molded with a resin.

7. The electronic device according to claim 1, wherein said individual parts are selected from capacitors and diodes.

8. The electronic device according to claim 7, wherein said individual parts are bonded onto said lead frames by eutectic solder.

9. The electronic device according to claim 7, wherein said rubbery material is silicone rubber.

* * * * *